United States Patent [19]

Welch et al.

[11] Patent Number: 4,753,866

[45] Date of Patent: Jun. 28, 1988

[54] METHOD FOR PROCESSING AN INTERLEVEL DIELECTRIC SUITABLE FOR VLSI METALLIZATION SCHEMES

[75] Inventors: Michael T. Welch, Sugar Land; Willard E. Lones, San Antonio, both of Tex.

[73] Assignee: Texas Instruments Incorporated, Dallas, Tex.

[21] Appl. No.: 831,900

[22] Filed: Feb. 24, 1986

[51] Int. Cl.$^4$ ................................................. G03C 5/00
[52] U.S. Cl. ..................................... 430/313; 430/314; 430/317; 430/330
[58] Field of Search ................ 430/313, 314, 317, 330

[56] References Cited

U.S. PATENT DOCUMENTS

| 4,508,815 | 4/1985 | Ackmann et al. | 430/314 |
| 4,549,927 | 10/1985 | Goth et al. | 156/643 |
| 4,605,470 | 8/1987 | Gwozdz et al. | |

FOREIGN PATENT DOCUMENTS

| 0130432 | 8/1982 | Japan | 430/330 |
| 0099723 | 6/1984 | Japan | 430/330 |

OTHER PUBLICATIONS

IBM Tech. Discl. Bulletin, vol. 27, No. 2, Jul., 1984, Doublecoat Planar Polyimide Process, J. P. Kent, pp. 1149–1150.

A. C. Adams, "Plasma Planarization", Solid State Technology, 178, Apr. 1981.

Primary Examiner—Richard R. Bueker
Assistant Examiner—Patrick J. Ryan
Attorney, Agent, or Firm—Larry C. Schroeder; James T. Comfort; Melvin Sharp

[57] ABSTRACT

A method of processing an interlevel dielectric layer in a VLSI device having a plurality of leads which includes depositing a layer of photoresist over the dielectric layer. The photoresist is then patterned to open areas where interlevel contacts are to be formed and then heated to a sufficiently high temperature and for a sufficient time to remove solvents and obtain a desired slope surrounding the open areas. The photoresist and dielectric is etched to planarize the dielectric surface, to expose the underlying leads and to remove all of the photoresist.

13 Claims, 4 Drawing Sheets

METHOD FOR PROCESSING AN INTERLEVEL DIELECTRIC SUITABLE FOR VLSI METALLIZATION SCHEMES

BACKGROUND

The present invention relates to a method for processing a dielectric layer in a VLSI device to simultaneously planarize the dielectric surface and to open lead contacts so that interlevel interconnects can be established.

Integration of large scale and very large scale multi-level semiconductor devices is forcing the industry away from traditional methods of producing metallic interconnect systems. The amount of undercutting present with wet chemical etching of metal interconnects has resulted in reactive ion etching replacing the latter. Reactive ion etching for VLSI interconnects produces minimal undercutting and resultant line width loss. However, the substantially straight sidewall produced by reactive ion etching results in severe steps in the dielectric layer. Thinning of metal interconnects deposited over these sidewalls causes high lead resistance. Moreover, the inability of reactive ion etching to remove metal from the oxide sidewalls results in conductive filaments which run parallel to the first level interconnects and on top of the dielectric. These filaments short upper level interconnects together and lead to device reliability problems and/or failure.

Accordingly, it is an object of the invention to provide an improved method of interconnect metallization. It is a further object of the invention to provide an improved method of processing a dielectric layer for the establishment of interconnects.

SUMMARY OF THE INVENTION

According to the invention there is provided a method of processing an interlevel dielectric layer in a VLSI device having a plurality of leads which includes depositing a layer of photoresist over the dielectric layer. The photoresist is then patterned to open areas where interlevel contacts are to be formed and then heated to a sufficiently high temperature and for a sufficient time to remove solvents and obtain a desired slope surrounding the open areas. The photoresist and dielectric is etched to planarize the dielectric surface, to expose the underlying leads and to remove all of the photoresist.

Preferably, sufficient thickness of photoresist is deposited so that following etching a minimum thickness of 7,000 angstroms of dielectric is left and no photoresist remains.

Advantageously, a substantially non-selective etch is employed to leave the dielectric surface with substantially the same shape as that of the photoresist.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 13–18 are greatly enlarged sectional views of a small portion of a chip showing stages in the formation of interconnects where the device topography is severe.

DETAILED DESCRIPTION WITH REFERENCE TO THE DRAWINGS

Figure 1:
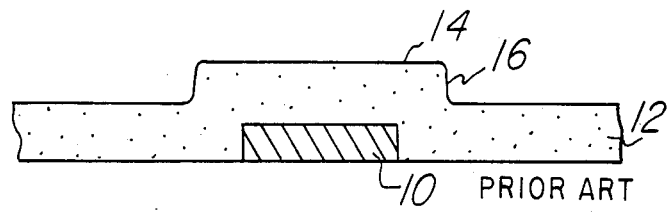
FIGS. 1–6 are greatly enlarged sectional views of a small portion of a chip showing the lead and interlevel dielectric processing to form a base for deposition of a metal interconnect.
Figure 2:
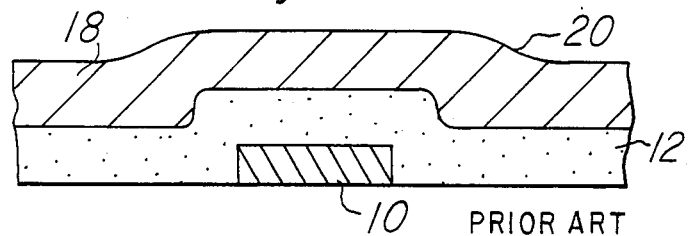
Figure 3:
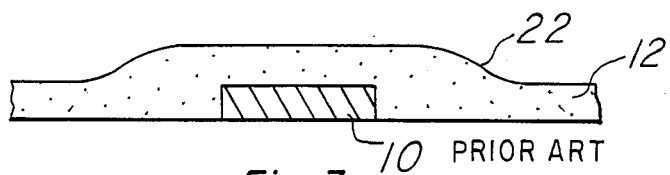
Figure 4:
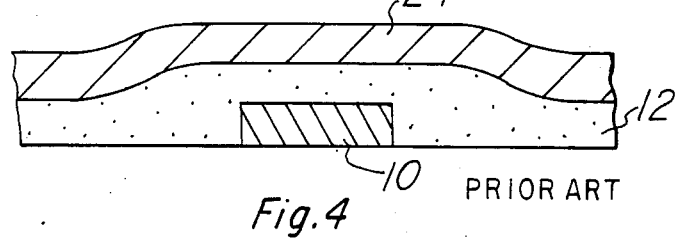
Figure 5:
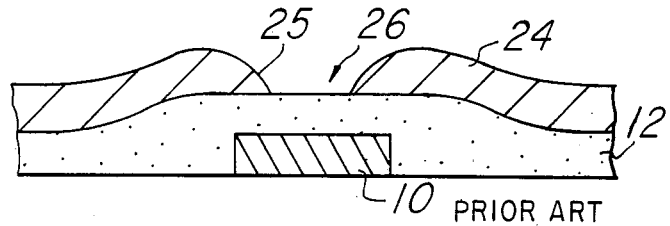
Figure 6:
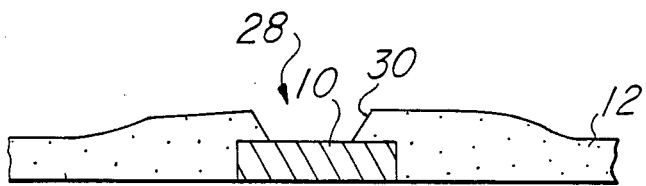

Referring to FIGS. 1 to 6 which illustrate standard processing technology, there is shown a lead 10 over which is deposited an overlying approximately 1.5 micron thick layer of plasma oxide 12 which forms a pedestal 14 with steep sidewalls due to the presence of lead 10. Any attempt to deposite metal over the steep sidewalls 16 would result in a thinning of the metal in the sidewall region and a consequent high resistance. Deposition of a viscous photoresist layer 18 as shown in FIG. 2, produces an upper photoresist surface 20 which has more gently sloped sidewalls than does the underlying dielectric 12. As shown in FIG. 3, etching off the photoresist with an etchant that is substantially non-selective produces a dielectric upper surface 22 that has substantially the same profile as the photoresist 20 had prior to etching. Application of another photoresist layer 24 over the dielectric 12 as shown in FIG. 4 is followed by exposing and developing the photoresist to create an opening 26 in the latter over the lead 10. The photoresist 24 is then heated to about 160° C. for about 15 minutes to slope the sides 25 of the opening 26. Subsequent etching of the photoresist 24 and dielectric 12 leaves an opening 28 in the dielectric with sides 30 sloped the same as were the sides of photoresist 24. Metal deposition into opening 28 produces an interconnect layer of substantially uniform thickness.

Figure 7:
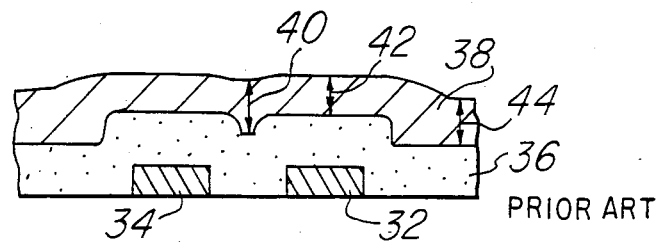
FIGS. 7–9 are greatly enlarged sectional views of a chip showing the effect of lead spacing on photoresist thickness uniformity and the effect on dielectric etching.
Figure 8:
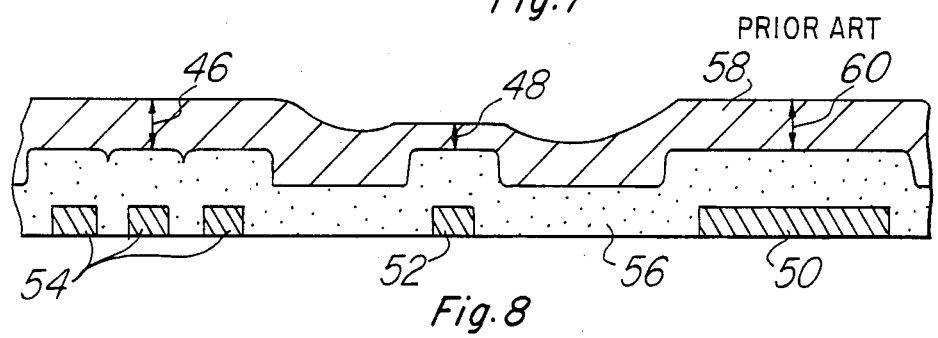
Figure 9:
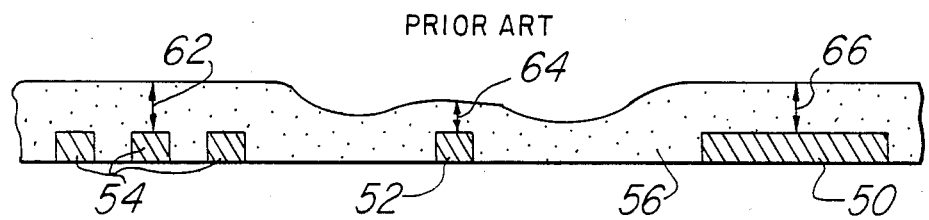

The effect of lead spacing on photoresist thickness is shown in FIGS. 7 and 8. The proximity of two leads 32 and 34 results in an elevation of the plasma oxide 36 deposited over these two leads as compared with the level of the plasma oxide on either side of the leads. The thickness 42 of photoresist deposited over the dielectric 36 directly above the lead 32 is less than that 44 adjacent to lead 32. Similarly, in FIG. 8, the thickness of photoresist 48 above a single lead 52 with no other leads nearby is less than that above a region such as 46 having several relatively closely packed leads 54 or that 60 above a single wide lead 50. Etching of the dielectric 56 exposes lead 52 before any of the other leads shown because of the latter-mentioned non-uniformity in the photoresist layer 58 as seen in FIG. 9.

Figure 10:
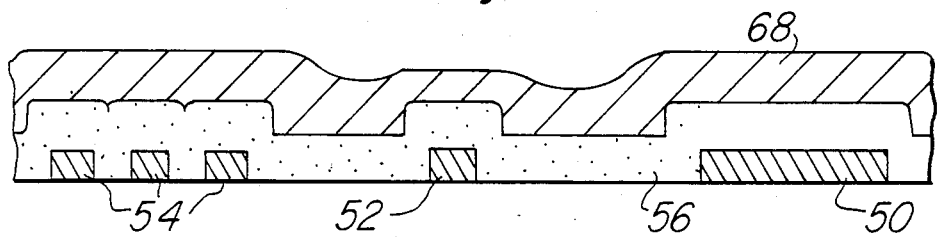
FIGS. 10–13 are greatly enlarged sectional views of a small portion of a chip showing stages in the formation of interconnects.
Figure 11:
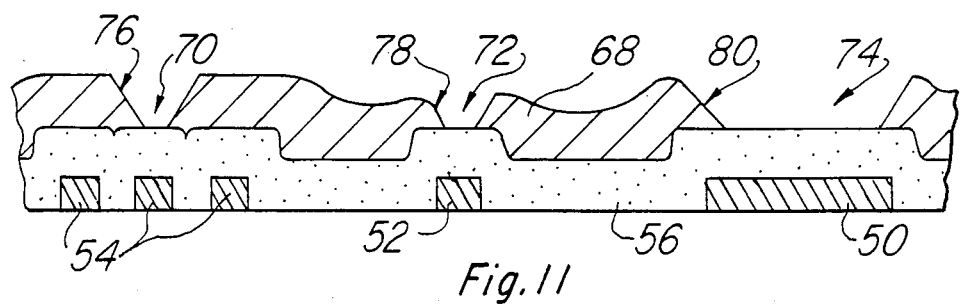
Figure 12:
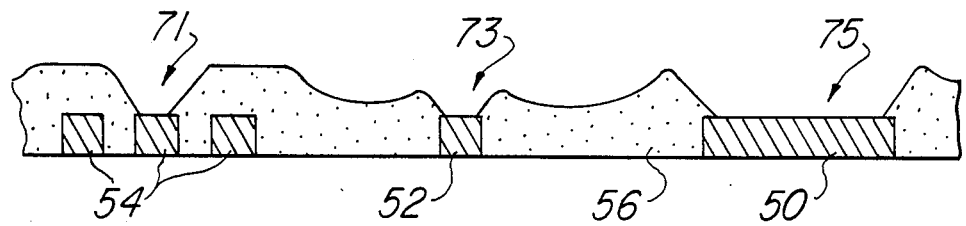
Figure 13:
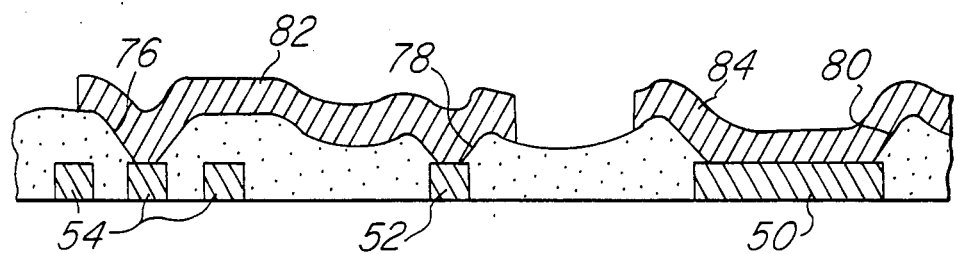
Figure 14:
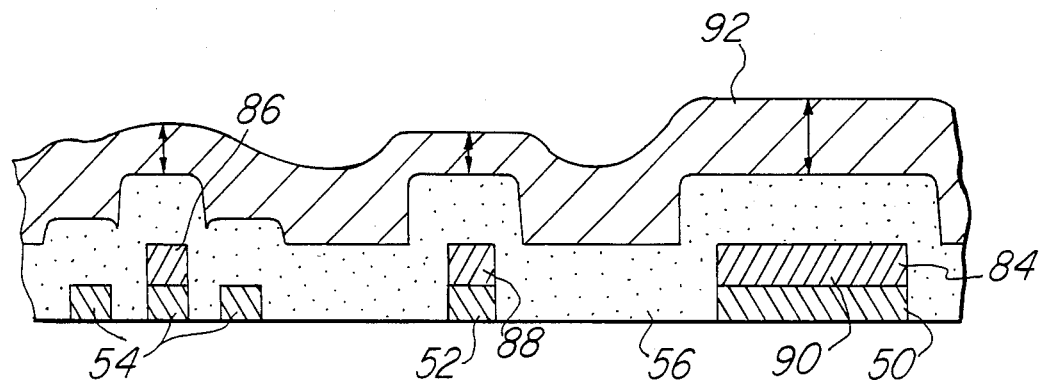
Figure 15:
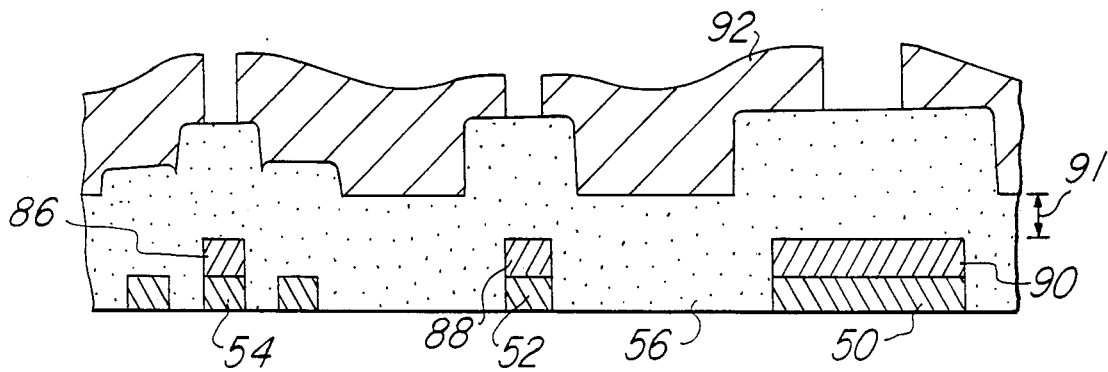
Figure 16:
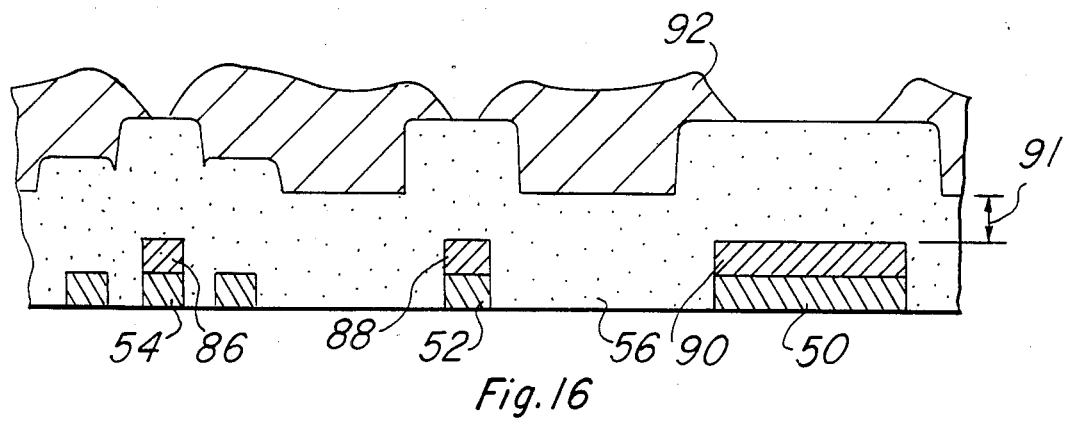
Figure 17:
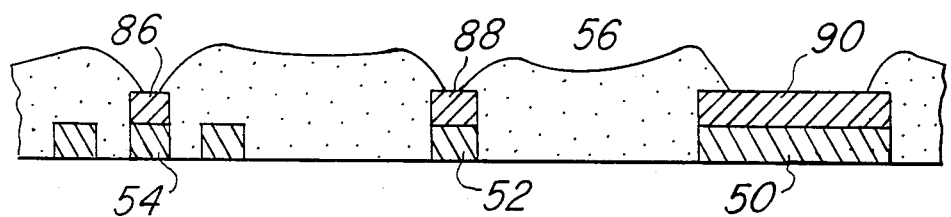
Figure 18:
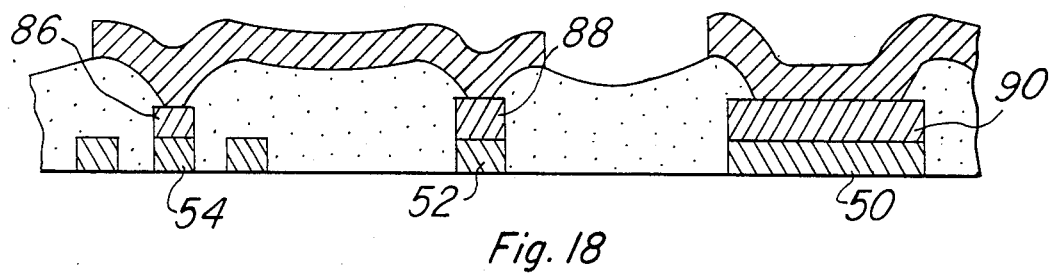

According to a preferred embodiment of the invention and starting with the photoresist deposition of about 9/10 microns thickness as shown in FIG. 10 (which is the same as that shown in FIG. 8) the photoresist 68 is patterned to create openings 70, 72, and 74. The patterned photoresist 68 is then heated up to about 160° C. for a period of about 15 minutes in order to cause the photoresist to flow and slope the sidewalls 76, 78 and 80 of openings 70, 72, and 74, respectively, as shown in FIG. 11. Using a non-selective or mildly selective etch process via openings 71, 73 and 75 in the dielectric 56 are etched in regions 70, 72 and 74, respectively, and, simultaneously, the photoresist is etched so as to transpose the gently sloped relatively planar surface of the photoresist 68 to the dielectric as seen in FIG. 12. Via etch and planarization is followed by deposition of a layer of metal 82 over the surface of the dielectric 56 and via openings 71, 73 and 75. The metal 82 is then patterned and etched to form interconnect layers 82 and 84 as seen in FIG. 13. Similarly, in cases where there is a severe variation in topography as shown in FIG. 14, the latter method can also be applied. First a low temperature plasma oxide dielectric 56 is conformally deposited over the pillar interconnects and conductors and photoresist 92 is deposited over the dielectric 56 as seen in FIG. 14. Openings in the photoresist 92 above each lead pillar interconnect 86, 88 and 90 are etched as seen in FIG. 15. In this case pillars 86, 88 and 90 have previously been formed atop leads 54, 52, and 50. Next the photoresist 92 is heated as before to slope the sidewalls of each hole. Finally, the etching step is carried out and results in via contact openings above all preselected leads 54, 52 and 50 exposing the pillars 86,88 and 90 respectfully, and leaving the side walls exposed as seen in FIGS. 16 and 17 as well as simultaneously removing the photoresist and planarizing the surface of dielectric 56. A subsequent interconnect metal deposition and patterning shown in FIG. 18 is made.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A method for processing an interlevel dielectric layer having an upper and a lower surface in a VLSI device, and having a substantially equal thickness over each of a plurality of leads lying under said lower surface and having a non-planar upper surface, comprising:
   depositing a layer of photoresist over said dielectric layer;
   patterning said photoresist to open an area where an interlevel contact is to be formed;
   heating said photoresist to a sufficiently high temperature and for a sufficient time to remove solvents and obtain a desired slope surrounding the open area; and
   etching the photoresist and underlying dielectric etchant until said underlying lead is exposed, all of the photoresist is etched and the shape of a top surface of the dielectric is substantially the same as the shape of a top surface of the dielectric of the flowed photoresist before etching.

2. A method according to claim 1, wherein sufficient photoresist is deposited so that following said etching step after all the photoresist is removed said dielectric has a minimum thickness of at least 7,000 angstroms, except in an area where the interlevel contact is formed.

3. A method according to claim 1, wherein said dielectric is plasma oxide.

4. A method according to claim 3, wherein said slope is sufficient so that no significant sidewall thinning of metal deposited over said open areas occurs.

5. A method according to claim 1, wherein said heating step elevates the temperature of said photoresist to 160° C. and is maintained for approximately 15 minutes.

6. A method according to claim 1, wherein said etching step is done with an etchant that is substantially non-selective.

7. A method according to claim 3, wherein said slope is sufficient so that the resistance of an interconnect metal deposited over the sidewall is substantially less than the interconnect resistance of the entire interconnect.

8. A method for establishing a metal interconnect to a lead on a surface of a VLSI device, comprising:
   depositing a conformal layer of dielectric over said lead and surrounding surface of a thickness of at least approximately 2½ microns;
   depositing a layer of photoresist over said dielectric layer;
   patterning said photoresist to open an area above said lead;
   heating said photoresist to a sufficiently high temperature and for a sufficient time to remove solvents and obtain a desired slope surrounding the open area;
   etching the photoresist and underlying dielectric etchant until said underlying leads are exposed and dielectric surface is planar; and
   depositing and patterning a metal interconnect over said lead.

9. A method according to claim 8, wherein a lowest level of said dielectric surface is at least 7,000 Angstroms above an upper level of said lead.

10. A method according to claim 9, wherein said slope is sufficient so that no significant sidewall thinning of metal deposited over said open area occurs.

11. A method according to claim 10, wherein said heating step elevates the temperature of said photoresist to about 160° C. for about 15 minutes.

12. A method according to claim 8, wherein said etching step is done with an etchant that is substantially non-selective.

13. A method according to claim 9, wherein said slope is sufficient so that the resistance of an interconnect metal deposited over the sidewall is substantially less than the interconnect resistance of the entire interconnect.

* * * * *

UNITED STATES PATENT AND TRADEMARK OFFICE
CERTIFICATE OF CORRECTION

PATENT NO. : 4,753,866
DATED : June 28, 1988
INVENTOR(S) : Michael Welch and Willard E. Lones It is certified that error appears in the above-identified patent and that said Letters Patent is hereby corrected as shown below:

CLAIM 1, Line 18, delete "of the dielectric"

Signed and Sealed this

Eighteenth Day of September, 1990

Attest:

HARRY F. MANBECK, JR.

*Attesting Officer*          *Commissioner of Patents and Trademarks*